(12) United States Patent
Nomoto

(10) Patent No.: US 6,826,214 B2
(45) Date of Patent: Nov. 30, 2004

(54) DEVICE SUPPORTING APPARATUS

(75) Inventor: Hiroshi Nomoto, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 73 days.

(21) Appl. No.: 10/143,009

(22) Filed: May 13, 2002

(65) Prior Publication Data

US 2002/0167978 A1 Nov. 14, 2002

(30) Foreign Application Priority Data

May 14, 2001 (JP) ....................................... 2001-142586

(51) Int. Cl.[7] ................................................. H01S 3/04
(52) U.S. Cl. .......................................... 372/36; 372/34
(58) Field of Search .................................... 322/36, 34

(56) References Cited

U.S. PATENT DOCUMENTS

| 3,961,666 A | * | 6/1976 | Suzuki et al. ............... 165/129 |
| 4,727,554 A | * | 2/1988 | Watanabe ..................... 372/36 |
| 5,550,853 A | * | 8/1996 | Ostler ......................... 372/34 |
| 5,901,167 A | * | 5/1999 | Sukhman et al. ............. 372/58 |
| 6,259,600 B1 | * | 7/2001 | Talbot et al. ................ 361/687 |
| 6,459,577 B1 | * | 10/2002 | Holmes et al. ............. 361/690 |

* cited by examiner

Primary Examiner—Minsun Oh Harvey
Assistant Examiner—James Menefee
(74) Attorney, Agent, or Firm—McDermott Will & Emery LLP

(57) ABSTRACT

A device supporting assembly 4 includes a pair of heat sinks 18, a pair of support plates 17 arranged at opposite sides of the heat sinks 18 each for supporting eight semiconductor lasers 3 through a base 16, Peltier elements arranged between the heat sinks 18 and support plates 17, and thermistors 22 for measuring the temperature of the bases 16. The pair of heat sinks 18 have numerous fins in the form of comb teeth defining numerous openings acting as air passages between an air inlet and an air outlet. Exhaust fans 21 are arranged at outlet ends of the openings.

10 Claims, 4 Drawing Sheets

DEVICE SUPPORTING APPARATUS

BACKGROUND OF THE INVENTION

1. Field of the Invention

The present invention relates to a device supporting apparatus for supporting, en bloc and in a temperature-controllable state, a plurality of devices such as semiconductor lasers or CPUs that require temperature control.

2. Description of the Related Art

The semiconductor laser, for example, becomes heated as it emits light. However, in order to emit light steadily and efficiently, the semiconductor laser must be controlled to a fixed temperature (e.g. 25 degrees centigrade). For this purpose, a conventional supporting apparatus for supporting semiconductor lasers includes a cooling mechanism employing a heat sink and a cooling fan.

In the conventional device supporting apparatus with the cooling mechanism, the heat sink and cooling fan are arranged parallel to device supporting surfaces. By the action of the cooling fan, air passes through spaces between fins in the heat sink extending perpendicular to the device supporting surfaces, to be discharged in a direction perpendicular to the device supporting surfaces.

The conventional device supporting apparatus having such a construction requires a certain space around the apparatus to secure airflow passages. It is therefore impossible to juxtapose a plurality of device supporting apparatus, which encumbers a high-density arrangement of numerous devices for support.

SUMMARY OF THE INVENTION

The object of the present invention, therefore, is to provide a device supporting apparatus for enabling an effective temperature control of numerous devices even when the devices are placed in a high-density arrangement for support.

The above object is fulfilled, according to the present invention, by a device supporting apparatus for supporting a plurality of devices in a temperature controllable state, comprising a heat sink having an air inlet, an air outlet, and a plurality of fins arranged between the air inlet and the air outlet; a pair of support members arranged at opposite sides of the heat sink and perpendicular to the air inlet and the air outlet for supporting a plurality of devices requiring temperature control; and a ventilating mechanism for causing air flows to move from the air inlet toward the air outlet.

With this device supporting apparatus, numerous devices, even when placed in a high-density arrangement, may be temperature-controlled effectively.

In a preferred embodiment of the invention, Peltier elements are arranged between the heat sink and support members.

This arrangement realizes an improved efficiency of exchanging thermal energy between the heat sink and support members.

Where the devices requiring temperature control are semiconductor lasers with exit ends thereof connected to optical fibers, the air outlet is disposed to direct outgoing air away from the optical fibers.

This construction is effective to avoid variations in the light transmission efficiency of the optical fibers due to contact between the optical fibers and the air discharged from the heat sink.

In another aspect of the invention, a device supporting apparatus for supporting a plurality of devices in a temperature controllable state, comprises a pair of heat sinks having numerous fins arranged in form of comb teeth in opposed rows contacting each other at distal ends thereof, thereby defining numerous openings extending between an air inlet and an air outlet; a pair of support members arranged at proximal ends of the fins and perpendicular to the air inlet and the air outlet, respectively, for supporting a plurality of devices requiring temperature control; and exhaust fans opposed to outlet ends of the openings.

In a further aspect of the invention, a device supporting apparatus for supporting a plurality of devices in a temperature controllable state, comprises a pair of heat sinks having numerous fins arranged in form of comb teeth in opposed rows contacting each other at distal ends thereof, thereby defining numerous openings extending between an air inlet and an air outlet; a pair of support members arranged at arranged at proximal ends of the fins and perpendicular to the air inlet and the air outlet, respectively, for supporting a plurality of devices requiring temperature control; Peltier elements arranged between the heat sinks and the support members; and exhaust fans opposed to outlet ends of the openings.

Other features and advantages of the present invention will be apparent from the following detailed description of the embodiment of the invention.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENT

An embodiment of the present invention will be described hereinafter with reference to the drawings.

Figure 1:
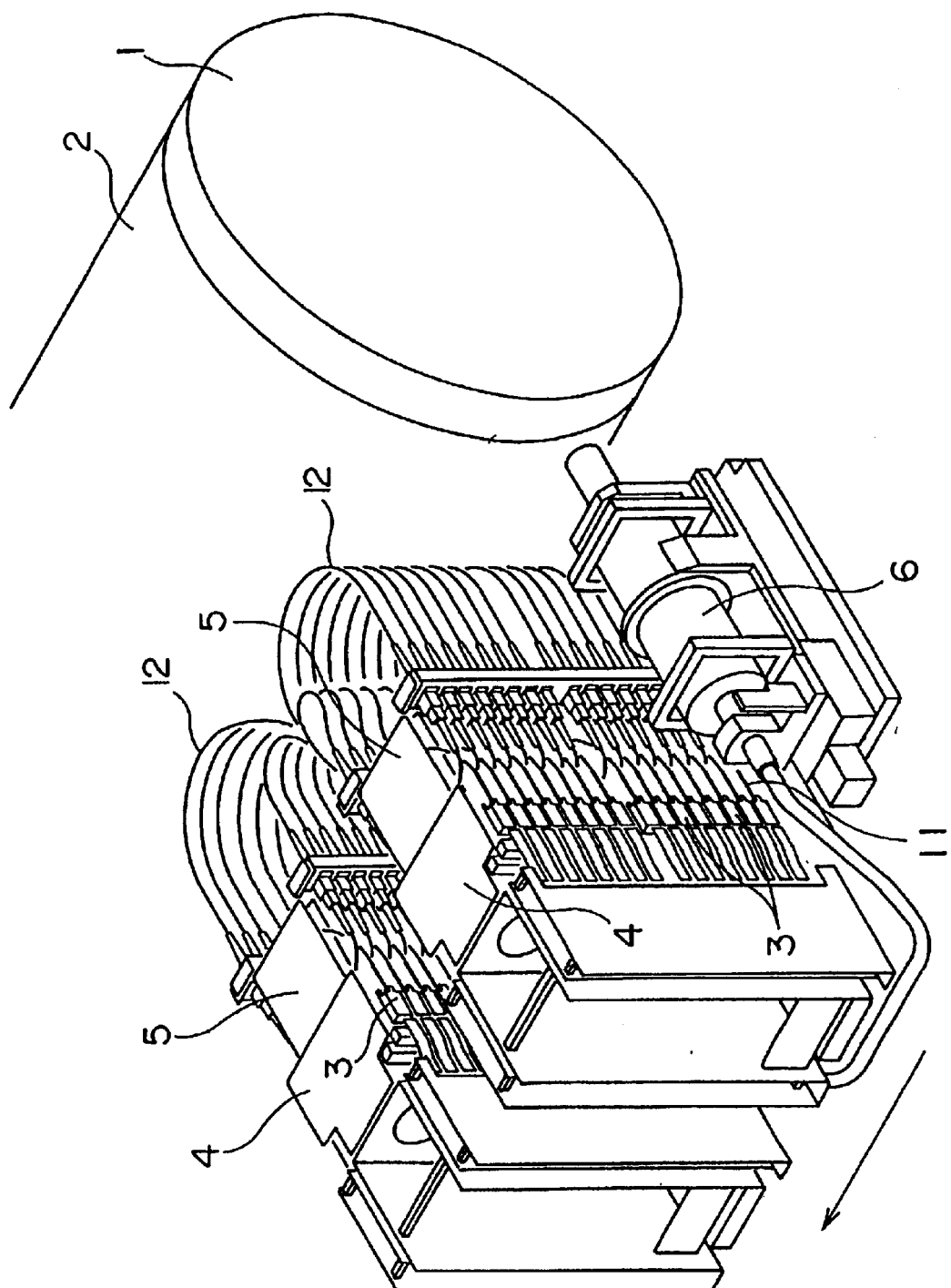
FIG. 1 is a perspective view of a principal portion of an image recording apparatus including a device supporting assembly.

The construction of an image recording apparatus having a device supporting apparatus according to the invention will be described first. FIG. 1 is a perspective view of a principal portion of the image recording apparatus including a device supporting assembly 4 acting as the device supporting apparatus according to the invention.

This image recording apparatus is used to record images on a sensitive material 2 mounted peripherally of a drum 1 by emitting a laser beam from an imaging optical system 6. The apparatus includes the device supporting assembly 4 for supporting numerous semiconductor lasers 3 acting as devices requiring temperature control, and a slack storage assembly 5 for supporting numerous optical fibers 11 optically connecting the semiconductor lasers 3 to the imaging optical system 6.

In this image recording apparatus, the imaging optical system 6 emits a laser beam modulated according to image signals while the drum 1 is rotated by a motor not shown, and a recording head having the device supporting assembly 4, slack storage assembly 5 and imaging optical system 6 is moved in a direction indicated by an arrow in FIG. 1. In this way, the laser beam scans the sensitive material 2 to record an image thereon.

Figure 2:
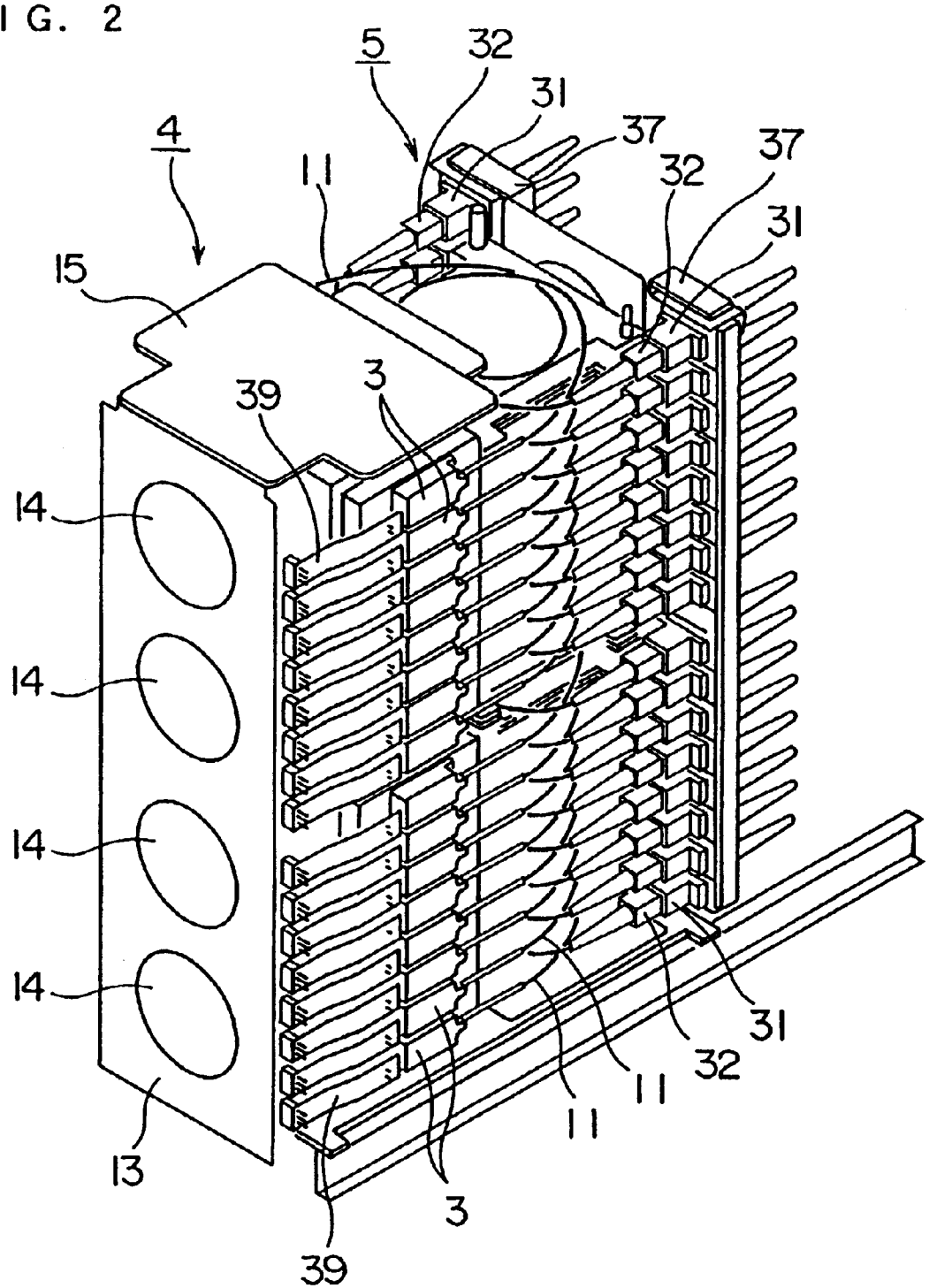
FIG. 2 is an enlarged perspective view of a portion of the image recording apparatus including the device supporting assembly and a slack storage assembly.

FIG. 2 is an enlarged perspective view of a portion of the image recording apparatus including the device supporting assembly 4 and slack storage assembly 5 shown in FIG. 1. FIG. 2 shows only one half of the device supporting assembly 4 and one half of the slack storage assembly 5 provided for the image recording apparatus.

One half of the device supporting assembly 4 supports a total of 32 semiconductor lasers 3 arranged on right and left side surfaces thereof (only 16 lasers on the right side surface being shown in FIG. 2). The device supporting assembly 4 has a top plane closed by a cover 15, and a rear plane closed by a cover 13. The cover 13 defines vent openings 14.

Though the semiconductor lasers 3 and optical fibers 11 are illustrated as separate objects herein, these are commercially available as integrated goods (i.e. semiconductor lasers with fibers). Though not shown in the drawings, the optical fibers 11 have lenses mounted at ends thereof connected to the semiconductor lasers 3.

Each semiconductor laser 3 is connected at an exit end thereof to one of the optical fibers 11. The end of each optical fiber 11 remote from the semiconductor laser 3 is connected to a connector 32. The portion of each optical fiber 11 extending from the semiconductor laser 3 to the connector 32 is fixedly supported by the slack storage assembly 5. Each connector 32 is connected to an adaptor 31. These adaptors 31 are connected to optical fibers 12 connected to the imaging optical system 6 (FIG. 1). Numeral 39 in FIG. 2 denotes transmission lines for transmitting electrical signals to drive the respective semiconductor lasers 3.

Figure 3:
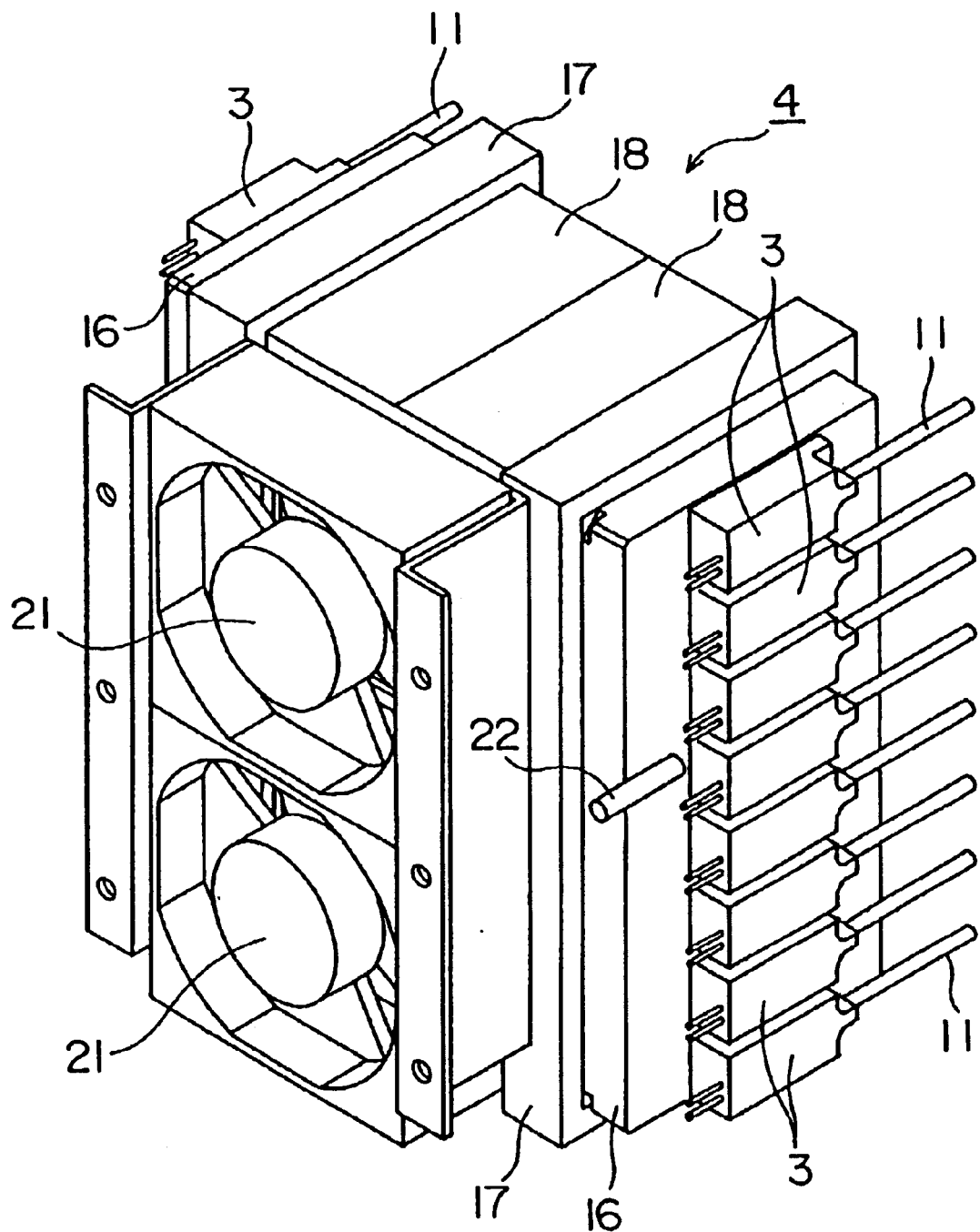
FIG. 3 is a perspective view of a principal portion of the device support assembly.
Figure 4:
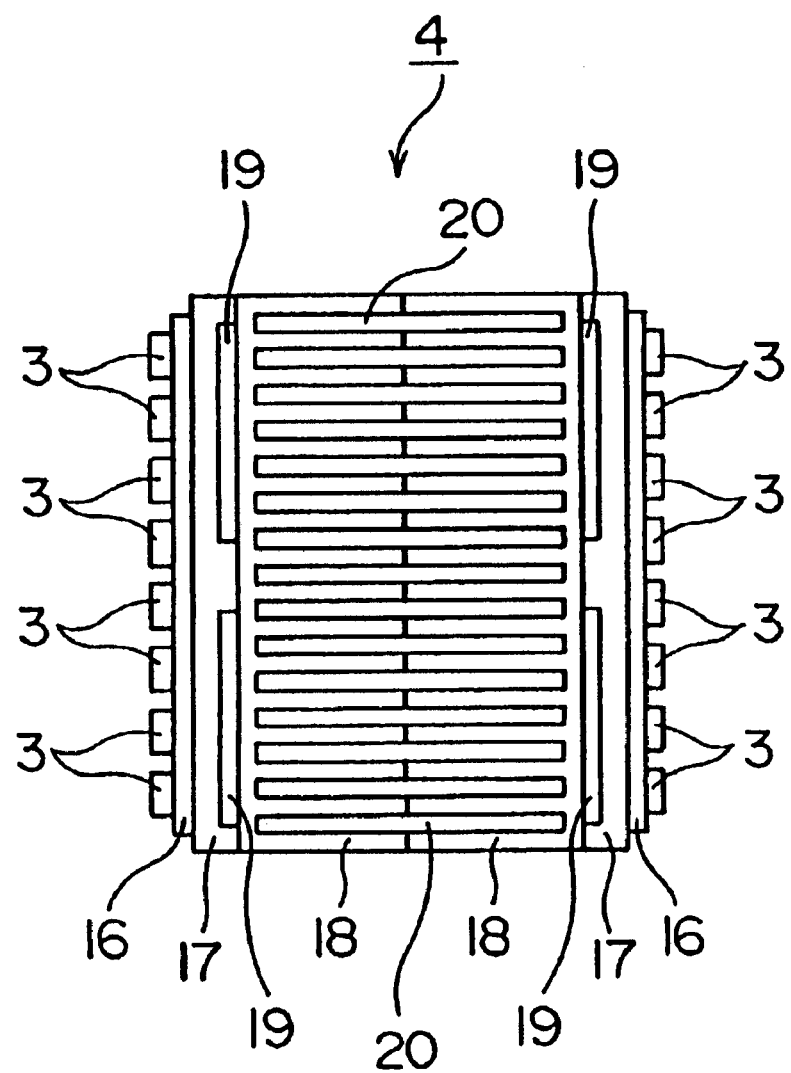
FIG. 4 is a front view of the principal portion of the device support assembly.

The construction of the device support assembly 4 according to the invention will be described next. FIG. 3 is a perspective view of a principal portion of the device support assembly 4. FIG. 4 is a front view of the principal portion of the device support assembly 4.

FIGS. 3 and 4 show only one unit of the device support assembly 4. The device support assembly 4 shown in FIG. 2 is a combination, in vertical arrangement, of two of the device support unit shown in FIGS. 3 and 4. Thus, as shown in FIG. 1, the image recording apparatus uses four of the device support unit shown FIGS. 3 and 4. In this specification, one unit of the device support assembly 4 and four units thereof are both called the device support assembly 4.

Referring to FIGS. 3 and 4, the device supporting assembly 4 according to the invention includes a pair of heat sinks 18, a pair of support plates 17 arranged at opposite sides of the heat sinks 18 each for supporting eight semiconductor lasers 3 through a base 16, four Peltier elements 19 arranged between the heat sinks 18 and support plates 17, and thermistors 22 for measuring the temperature of the bases 16.

The heat sinks 18 have numerous fins arranged in the form of comb teeth and defining numerous openings 20 acting as air passages extending between an air inlet and an air outlet. Thus, the pair of support plates 17 are arranged perpendicular to the air inlet and outlet (i.e. parallel to the air passages) formed in the heat sinks 18. Upper and lower exhaust fans 21 are arranged at outlet ends of the openings 20 to act as a ventilating mechanism. These exhaust fans 21 are opposed to the openings 14 in the cover 13 shown in FIG. 2.

When driven continuously to record an image, the semiconductor lasers 3 are heated to a high temperature. On the other hand, in order to emit light steadily and efficiently, the semiconductor lasers 3 must be controlled to a predetermined temperature of approximately 25 degrees centigrade.

For this purpose, the above device support assembly 4 has the thermistors 22 for measuring the temperature of semiconductor lasers 3 through the bases 16. When the temperature of the bases 16 is higher than the predetermined temperature, the Peltier elements 19 are driven to cool the support plates 17. The Peltier elements 19 heated as a result of cooling the support plates 17 are cooled, at surfaces thereof facing away from the support plates 17, by the heat sinks 18.

The heat sinks 18 tend to be heated by receiving thermal energy from the Peltier elements 19. However, by the action of the exhaust fans 21, air flows from inlets to outlets of the openings 20 defined by the numerous fins of the heat sinks 18. The heat sinks 18 are cooled by such airflows. The support plates 17 and Peltier elements 19 are arranged perpendicular to the air inlet and outlet formed in the heat sinks 18. The fins of the heat sinks 18 are efficiently cooled by the airflows passing through the openings 20.

The air heated while passing through the openings 20 in the heat sinks 18 is discharged by the action of the exhaust fans 21 through the openings 14 shown in FIG. 2. The air outlet in the heat sinks 18 is disposed away from the optical fibers 11 and 12 shown in FIGS. 1 and 2. That is, the air discharged from the heat sinks 18 does not flow toward the optical fibers 11 and 12.

Generally, the light transmission efficiency of the optical fiber is variable with temperature. Thus, when the optical fibers 11 and 12 shown in FIGS. 1 and 2 contact the air heated by the heat sinks 18, the light transmission efficiency thereof varies to a great extent to produce an adverse effect on image recording. To avoid such an inconvenience, as noted above, the air outlet of the heat sinks 18 is disposed away from the optical fibers 11 and 12 to prevent the air discharged from the heat sinks 18 from contacting the optical fibers 11 and 12.

In the device supporting assembly 4 having the above construction, the support plates 17 and Peltier elements 19 are arranged perpendicular to the air inlet and outlet formed in the heat sinks 18. Consequently, as shown in FIGS. 1 and 2, the device supporting assembly 4 may comprise a plurality of units arranged vertically and sideways so that the air passages defined by the openings 20 in the heat sinks 18 extend parallel to one another. This enables a high-density arrangement of numerous devices.

In the above embodiment, the Peltier elements 19 are used to cool the support plates 17. When, for example, the temperature of the semiconductor lasers 3 is lower than the predetermined temperature, the support plates 17 may be heated by the Peltier elements 19. In this case, the heat sinks 18 heat, with normal temperature air, the surfaces of Peltier elements 19 facing away from the support plates 17.

In the above embodiment, the Peltier elements 19 are arranged between the heat sinks 18 and support plates 17, so that thermal energy is exchanged between the support plates 17 and heat sinks 18 through the Peltier elements 19, thereby increasing the efficiency of heat exchange. The Peltier elements 19 may be omitted, with thermal energy exchanged directly between the support plates 17 and heat sinks 18.

In the above embodiment, the exhaust fans 21 are used as a ventilating mechanism for causing air flows. Other ventilating mechanisms such as pumps or blowers may be used instead.

Further, in the above embodiment, the invention is applied to the device supporting apparatus for supporting the semiconductor lasers 3 as devices requiring temperature control. The invention may be applied to a device supporting apparatus for supporting CPUs or other transistor devices, for example.

The present invention may be embodied in other specific forms without departing from the spirit or essential attributes thereof and, accordingly, reference should be made to the appended claims, rather than to the foregoing specification, as indicating the scope of the invention.

This application claims priority benefit under 35 U.S.C. Section 119 of Japanese Patent Application No. 2001-142586 filed in the Japanese Patent Office on May 14, 1997, the entire disclosure of which is incorporated herein by reference.

What is claimed is:

1. A semiconductor laser supporting apparatus for supporting a plurality of semiconductor lasers with exit ends thereof connected to optical fibers in a temperature controllable state, comprising:
    a heat sink including:
        an air inlet,
        an air outlet configured to direct outgoing air away from said optical fibers, and
        a plurality of fins, wherein
            each adjacent pair of said plurality of fins defines one of a plurality of air passages extending from said air inlet to said air outlet;
    a pair of support members arranged at opposite sides of said heat sink and perpendicular to said air inlet and said air outlet for supporting the plurality of semiconductor devices;
    a ventilating mechanism for causing air flows to move from said air inlet through said air passages toward said air outlet; and
    a slack storage assembly for supporting a plurality of optical fibers, the slack storage assembly including a plurality of plate members parallel to an alignment direction of the semiconductor lasers.

2. A semiconductor laser supporting apparatus as defined in claim 1, further comprising Peltier elements arranged between said heat sink and said support members.

3. A semiconductor laser apparatus according to claim 1, wherein the semiconductor lasers are mounted on support members aligned in a direction substantially identical to an alignment direction of the fins.

4. A semiconductor laser supporting apparatus for supporting a plurality of semiconductor lasers with exit ends thereof connected to optical fibers in a temperature controllable state, comprising:
    a pair of heat sinks, each of said pair of heat sinks including:
        an air inlet,
        an air outlet configured to direct outgoing air away from said optical fibers, and
        a plurality of fins arranged in a form of comb teeth, each of said fins including distal ends thereof, wherein
            each adjacent pair of said plurality of fins defines one of a plurality of air passages extending from said air inlet to said air outlet;
    a pair of support members arranged at proximal ends of said fins and perpendicular to said air inlet and said air outlet, respectively, for supporting the plurality of semiconductor lasers;
    exhaust fans opposed to said air outlets, wherein a fin of a first of said pair of heat sinks is in contact with an opposing fin of a second of said pair of heat sinks at respective distal ends thereof; and
    a slack storage assembly for supporting a plurality of optical fibers, the slack storage assembly including a plurality of plate members parallel to an alignment direction of the semiconductor lasers.

5. A semiconductor laser supporting apparatus as defined in claim 4, wherein said plurality of semiconductor lasers are supported by said support members through base members.

6. A semiconductor laser supporting apparatus as defined in claim 5, further comprising Peltier elements arranged between said heat sinks and said support members.

7. A semiconductor laser apparatus according to claim 4, wherein the semiconductor lasers are mounted on support members aligned in a direction substantially identical to an alignment direction of the fins.

8. A semiconductor laser supporting apparatus for supporting a plurality of semiconductor lasers with exit ends thereof connected to optical fibers in a temperature controllable state, comprising:
    a pair of heat sinks, each of said pair of heat sinks including:
        an air inlet,
        an air outlet configured to direct outgoing air away from said optical fibers, and
        a plurality of fins arranged in a form of comb teeth, each of said fins including distal ends thereof, wherein
            each adjacent pair of said plurality of fins defines one of a plurality of air passages extending from said air inlet to said air outlet;
    a pair of support members arranged at proximal ends of said fins of said heat sinks and perpendicular to said air inlets and said air outlets, respectively, for supporting the plurality of semiconductor lasers;
    Peltier elements arranged between said heat sinks and said support members;
    exhaust fans opposed to said air outlets to cause air flows to move from said air inlets toward said air outlets, wherein a fin of a first of said pair of heat sinks is in contact with an opposing fin of a second of said pair of heat sinks at respective distal ends thereof; and
    a slack storage assembly for supporting a plurality of optical fibers, the slack storage assembly including a plurality of plate members parallel to an alignment direction of the semiconductor lasers.

9. A semiconductor laser apparatus according to claim 8, wherein the semiconductor lasers are mounted on support members aligned in a direction substantially identical to an alignment direction of the fins.

10. A semiconductor laser supporting apparatus as defined in claim 8, wherein said plurality of semiconductor devices are supported by said support members through base members.

* * * * *